(12) United States Patent
Ryou et al.

(10) Patent No.: US 9,111,880 B2
(45) Date of Patent: Aug. 18, 2015

(54) METHOD OF FORMING A PATTERN IN A SEMICONDUCTOR DEVICE AND METHOD OF FORMING A GATE USING THE SAME

(71) Applicant: Samsung Electronics Co., Ltd.

(72) Inventors: Choong-Ryul Ryou, Suwon-si (KR); Hee-Sung Kang, Sungnam-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/499,948

(22) Filed: Sep. 29, 2014

(65) Prior Publication Data

US 2015/0017804 A1  Jan. 15, 2015

Related U.S. Application Data

(63) Continuation of application No. 13/845,851, filed on Mar. 18, 2013, now Pat. No. 8,846,304, which is a continuation of application No. 13/041,696, filed on Mar. 7, 2011, now Pat. No. 8,409,787, which is a (Continued)

(30) Foreign Application Priority Data

Dec. 26, 2003 (KR) .................. 2003-97427

(51) Int. Cl.
*G03F 7/26* (2006.01)
*H01L 21/3213* (2006.01)
(Continued)

(52) U.S. Cl.
CPC ...... *H01L 21/32139* (2013.01); *H01L 21/0271* (2013.01); *H01L 21/0337* (2013.01); *H01L 21/28132* (2013.01); *H01L 21/31144* (2013.01); *H01L 21/76895* (2013.01)

(58) Field of Classification Search
CPC ............ H01L 21/0337; H01L 21/0338; H01L 21/31144; H01L 21/3088; H01L 21/3086; H01L 21/32139; H01L 21/0274; H01L 27/11526; G03F 7/40
USPC ........... 430/313, 316, 314, 394, 311; 438/595
See application file for complete search history.

(56) References Cited

U.S. PATENT DOCUMENTS 6,110,837 A  8/2000  Linliu et al.
6,472,265 B1  10/2002  Hsieh (Continued)

FOREIGN PATENT DOCUMENTS

JP  7-307333  11/1995
JP  2002-280388  9/2002
JP  3326709 B2  9/2002

*Primary Examiner* — Caleen Sullivan
(74) *Attorney, Agent, or Firm* — Muir Patent Law, PLLC

(57) ABSTRACT

A method of forming a pattern in a semiconductor device is described. A substrate divided into cell and peripheral regions is provided, and an object layer is formed on a substrate. A buffer pattern is formed on the object layer in the cell region along a first direction. A spacer is formed along a sidewall of the buffer pattern in the cell region, and a hard mask layer remains on the object layer in the peripheral region. The buffer layer is removed, and the spacer is separated along a second direction different from the first direction, thereby forming a cell hard mask pattern. A peripheral hard mask pattern is formed in the peripheral region. A minute pattern is formed using the cell and peripheral hard mask patterns in the substrate. Therefore, a line width variation or an edge line roughness due to the photolithography process is minimized.

17 Claims, 20 Drawing Sheets

Related U.S. Application Data continuation of application No. 12/146,092, filed on Jun. 25, 2008, now Pat. No. 7,914,973, which is a continuation of application No. 11/020,825, filed on Dec. 22, 2004, now abandoned.

(51) Int. Cl.
*H01L 21/033* (2006.01)
*H01L 21/28* (2006.01)
*H01L 21/311* (2006.01)
*H01L 21/027* (2006.01)
*H01L 21/768* (2006.01)

(56) References Cited

U.S. PATENT DOCUMENTS

| | | |
|---|---|---|
| 6,475,891 B2 | 11/2002 | Moon |
| 6,723,607 B2 | 4/2004 | Nam et al. |
| 7,115,522 B2 | 10/2006 | Abatchev |
| 7,253,118 B2 | 8/2007 | Tran |
| 8,846,304 B2 * | 9/2014 | Ryou et al. ............ 430/314 |
| 2006/0134868 A1 | 6/2006 | Yoon et al. |

* cited by examiner

METHOD OF FORMING A PATTERN IN A SEMICONDUCTOR DEVICE AND METHOD OF FORMING A GATE USING THE SAME

CROSS-REFERENCE OF RELATED APPLICATIONS

This application is a continuation of and claims priority to U.S. application Ser. No. 13/845,851, filed on Mar. 18, 2013, which is a continuation application of and claims priority to U.S. application Ser. No. 13/041,696 filed Mar. 7, 2011 (issued as U.S. Pat. No. 8,409,787), which is a continuation application of and claims priority to U.S. patent application Ser. No. 12/146,092, filed Jun. 25, 2008 (issued as U.S. Pat. No. 7,914,973), which is a continuation application of U.S. patent application Ser. No. 11/020,825 filed Dec. 22, 2004 (now abandoned), which relies for priority upon Korean Patent Application No. 2003-97427 filed on Dec. 26,2003, the contents of each of which are herein incorporated by reference in their entirety.

BACKGROUND OF THE INVENTION

1. Field of the Invention

The present invention relates to a method of forming a pattern for a semiconductor device. More particularly, the present invention relates to a method of forming a pattern of which line width is much smaller and finer in a cell region than in a peripheral region of a semiconductor device.

2. Description of the Related Art

Forming a fine circuit on a semiconductor substrate includes an impurity implantation, a patterning process and an electrical connection between separated portions. Impurities are implanted on a small surface portion of a silicon substrate in a precise amount, and then a sacrificial layer is formed on the substrate including the impurities. Then, the sacrificial layer is patterned in accordance with a mask pattern, and the substrate or a thin layer on the substrate is partially removed using the sacrificial layer pattern as a mask, so that the substrate or the thin layer thereon has a pattern of separated portions. Finally, the separated portions of the substrate or the thin layer are electrically connected with each other, thereby forming a semiconductor device including an integrated circuit such as a very large scale integration (VLSI) chip. Here, a photolithography process, in general, is performed for defining the implantation region or forming the pattern.

According to the photolithography process, a photoresist material that is very sensitive to light is coated on the semiconductor substrate or a wafer, thereby forming a photoresist film on the wafer. The light such as an ultraviolet ray, an electron beam or an X-ray is irradiated onto the photoresist film through a mask or a reticle. Then, the photoresist film is selectively exposed to the light and developed through a predetermined process, thus finally a photoresist pattern is formed in accordance with or contrary to a mask pattern, which is referred to as a positive pattern or a negative pattern. In a subsequent process, while a portion of the substrate or a thin layer thereon covered by the photoresist pattern is protected from the process, the other portion of the substrate or the thin layer thereon exposed through the photoresist pattern is subjected to the process.

When the photoresist pattern is used as an etching mask, a portion of the thin layer exposed through the photoresist pattern is partially etched away, thus the thin layer on the substrate is formed into a predetermined pattern in accordance with the photoresist pattern.

The above photolithography process has certain drawbacks. Firstly, when the photoresist film is exposed to the light, an exposure condition may be minutely different from each point in a shot, so that a line width is varied throughout chips on the wafer.

Secondly, when the photoresist film is exposed to the light, an exposure condition of every shot may be minutely different from each other, so that a critical dimension (CD) of the chip is varied in accordance with a region of the wafer.

Thirdly, when an etching process is performed using the photoresist pattern as a mask, an edge line of an etched portion of the thin layer becomes very rough since the photoresist pattern becomes non-uniform, which is referred to as a line edge roughness phenomenon.

Due to the above-mentioned problems, a line width distribution of the patterns in each unit cell in a chip has a substantial effect on performance of the highly-integrated memory device such as the VLSI chip. Non-uniformity of the line width distribution causes electrical characteristics of each unit device in a chip or in a wafer to be non-uniform, thus causing various process failures in the semiconductor device. In addition, a non-uniform etching of the photoresist film degrades a short channel characteristic of the device, and a gate size reduction accelerates the degradation of the short channel characteristic of the device.

Accordingly, a manufacturing process for a high-integrated semiconductor device has required a new method of forming a pattern with more accuracy and fineness than by the photolithography process.

For example, Japanese Publication Patent No. 2002-280388 discloses a method of forming a line and space pattern having a minute pitch smaller than a resolution of the exposing process. In detail, a second insulating layer is formed on a sidewall of a first insulating layer pattern, and then the first insulating layer pattern is removed. An etching process is performed using the second insulating layer as an etching mask, thereby forming a pattern. However, when the second insulating layer is used as an etching mask, the pattern has the same line width across a whole surface of a substrate, and as a result, the pattern may not have a line width greater than that of the second insulating layer at any local area on the substrate. In addition, since the second insulating layer is shaped in accordance with the shape of the sidewall of the first insulating layer, various patterns may not be formed when the second insulating layer is used as an etching mask.

SUMMARY OF THE INVENTION

Accordingly, the present invention provides a method of forming a minute pattern having various line widths at different regions of a semiconductor substrate.

The present invention also provides a method of forming a gate pattern having various line widths at different regions of a semiconductor substrate.

According to one aspect of the present invention, there is provided a method of forming a pattern of a semiconductor device. A semiconductor substrate on which an object layer to be patterned is formed is provided, and the substrate is divided into a cell region and a peripheral region. A buffer layer is formed on the object layer, and the buffer layer is partially etched away from the object layer by a photolithography process. Therefore, the buffer layer in the cell region of the substrate is formed into a buffer pattern, and the buffer layer in the peripheral region of the substrate is completely removed. A hard mask layer is formed on the buffer pattern in the cell region and the object layer in the peripheral region. The hard mask layer is anisotropically and selectively etched away only in the cell region of the substrate, so that a spacer is formed along a sidewall of the buffer pattern in the cell region, and the hard mask layer still remains on the object layer in the peripheral region of the substrate. Then, the buffer pattern is removed from the object layer, so that only the spacer remains on the object layer along a first direction. The spacer is partially removed in a second direction different from the first direction and the hard mask layer is simultaneously removed, so that the spacer is separated along the second direction, thereby forming a cell hard mask pattern in the cell region and a peripheral hard mask pattern is formed in the peripheral region. The object layer is partially etched away using the cell hard mask pattern and the peripheral hard mask pattern as an etching mask.

The cell region of the substrate includes a plurality of unit memory devices, and a plurality of patterns having the same line widths is repeatedly formed in the cell region. The peripheral region of the substrate includes a plurality of peripheral circuits for driving the unit memory device, and each line width of the pattern can be different from the others. In addition, the line width of the pattern in the peripheral region is relatively greater as compared with that of the pattern in the cell region. In one embodiment, a width of the spacer is less than a critical dimension (CD) of a photolithography process. In one embodiment, the buffer layer comprises a material having an etching selectivity with respect to the hard mask layer. The hard mask layer can comprise a material having an etching selectivity with respect to both the object layer and the buffer layer. Examples of the buffer layer include a silicon oxide layer or a polysilicon layer. In case that the object layer comprises the same material as the buffer layer, a separation layer is further formed between the object layer and the buffer layer for separating the object layer from the buffer layer. The separation layer comprises a material having an etching selectivity with respect to the object layer. In one embodiment, the hard mask layer comprises a silicon oxynitride layer or a silicon oxide layer. The object layer can include a gate electrode layer, a silicon substrate in a field region or a metal layer for forming a metal wiring. In more detail, the object layer includes a cell gate, active/field pattern or a metal wiring of an I-type SRAM device having a straight active pattern. In one embodiment, a width of the spacer is less than a critical dimension (CD) of a photolithography process. A line width of the peripheral hard mask pattern is greater than that of the cell hard mask pattern.

Since the cell hard mask pattern is formed on sidewalls of the buffer pattern, a pair of patterns is repeatedly formed at regular intervals in the cell region. That is, the present invention may be applied to a method of manufacturing the semiconductor device in which a pair of patterns is repeated at regular intervals in the cell region. In addition, since the peripheral hard mask pattern is always formed without a limitation in its shape, the minute pattern in the peripheral region is readily formed in accordance with various design conditions.

According to another aspect of the present invention, there is provided another method of forming a pattern of a semiconductor device. A semiconductor substrate is provided. An object layer to be patterned is formed on the substrate, and the substrate is divided into a cell region and a peripheral region. A buffer layer is formed on the object layer, and the buffer layer is partially etched away from the object layer by a photolithography process such that the buffer layer in the cell region of the substrate is formed into a buffer pattern, and the buffer layer in the peripheral region of the substrate is removed. A spacer is formed along a sidewall of the buffer pattern, and the buffer pattern is removed from the object layer, so that only the spacer remains on the object layer along a first direction. A hard mask layer is formed on the object layer including the spacer extending along the first direction. The hard mask layer and the spacer are at least partially removed in a second direction different from the first direction in the cell region of the substrate, so that the spacer and the hard mask layer on the spacer are separated from each other along the second direction in the cell region. The hard mask layer is at least partially removed such that the hard mask layer on the spacer is removed in the cell region and the hard mask layer on the object layer is at least partially removed in the peripheral region, thereby forming a cell hard mask pattern in the cell region and a peripheral hard mask pattern in the peripheral region. The object layer is at least partially removed by etching using the cell hard mask pattern and the peripheral hard mask pattern as an etching mask. In one embodiment, a width of the spacer is less than a critical dimension (CD) of a photolithography process. The buffer layer can comprise a material having an etching selectivity with respect to the hard mask layer. The method can further comprise, in the case in which the object layer comprises the same material as the buffer layer, forming a separation layer between the object layer and the buffer layer for separating the object layer from the buffer layer, the separation layer comprising a material having a high etching selectivity with respect to the object layer. The spacer and the hard mask layer can comprise a material having a high etching selectivity with respect to the object layer and the buffer layer. In one embodiment, the hard mask layer is the same material as the spacer. The hard mask layer can comprise a silicon oxynitride layer or a silicon oxide layer. The object layer can include a gate electrode layer, a silicon substrate in a field region or a metal layer for forming a metal wiring.

Therefore, the pattern in the wafer may have a different line width according to the region of the wafer, and the line width may be less than the CD of the photolithography process. In addition, the line width variation due to the photolithography process may be minimized. Further, since the hard mask layer is uniformly etched away, line edge roughness due to a non-uniform etching may also be minimized.

According to another aspect of the present invention, there is provided a method of forming a gate in a semiconductor device. A gate oxide layer and a gate electrode layer are formed on a substrate, and the substrate is divided into a cell region and a peripheral region. A buffer layer is formed on the gate electrode layer, and the buffer layer is at least partially etched from the gate electrode layer by a photolithography process such that the buffer layer in the cell region of the substrate is formed into a buffer pattern, and the buffer layer in the peripheral region of the substrate is removed. A hard mask layer is formed on the buffer pattern in the cell region of the substrate and the gate electrode layer in the peripheral region of the substrate. The hard mask layer is selectively etched away only in the cell region of the substrate anisotropically, so that a spacer is formed along a sidewall of the buffer pattern in the cell region, and the hard mask layer still remains on the gate electrode layer in the peripheral region of the substrate. The buffer pattern is removed from the gate electrode layer, so that only the spacer remains on the gate electrode layer along a first direction. The spacer is at least partially removed in a second direction different from the first direction and the hard mask layer, so that the spacer is separated along the second direction, thereby forming a cell hard mask pattern in the cell region and a peripheral hard mask pattern in the peripheral region. The gate electrode layer is at least partially etched using the cell hard mask pattern and the peripheral hard mask pattern as an etching mask.

In one embodiment, the gate electrode layer comprises polysilicon.

The buffer layer can include a silicon oixde layer or a polysiliocn layer.

In one embodiment, the method includes, in case that the buffer layer includes the polysilicon layer, forming a separation layer between the gate electrode layer and the buffer layer for separating the gate electrode layer from the buffer layer, the separation layer comprising a material having a high etching selectivity with respect to polysilicon.

The hard mask layer can comprise a silicon oxynitride layer or a silicon oxide layer.

According to still another aspect of the present invention, there is provided a method of forming a gate in a semiconductor device. A gate oxide layer and a gate conductive layer are formed on a substrate that is divided into a cell region and a peripheral region. A buffer layer is formed on the gate conductive layer, and the buffer layer is at least partially etched from the gate conductive layer by a photolithography process such that the buffer layer in the cell region of the substrate is formed into a buffer pattern, and the buffer layer in the peripheral region of the substrate is removed. A spacer is formed on a sidewall of the buffer pattern, and the buffer pattern is removed from the gate conductive layer, so that only the spacer remains on the gate conductive layer along a first direction. A hard mask layer is formed on the gate conductive layer including the spacer extending along the first direction. The hard mask layer and the spacer are at least partially etched away in a second direction different from the first direction in the cell region of the substrate, so that the spacer and the hard mask layer on the spacer are separated from each other along the second direction in the cell region. The hard mask layer is at least partially etched away such that the hard mask layer on the spacer is removed in the cell region of the substrate and the hard mask layer on the gate conductive layer is at least partially removed in the peripheral region of the substrate, thereby forming a cell hard mask pattern in the cell region of the substrate and a peripheral hard mask pattern in the peripheral region of the substrate. The gate conductive layer is at least partially etched away using the cell hard mask pattern and the peripheral hard mask pattern as an etching mask.

Therefore, the gate pattern formed to have a smaller line width in the cell region than in the peripheral region. In addition, the line width variation and the line edge roughness due to the photolithography process may be minimized.

In one embodiment, the gate electrode layer comprises polysilicon.

The buffer layer can include a silicon oxide layer or a polysilicon layer.

In one embodiment, the method further comprises, in case that the buffer layer comprises polysilicon, forming a separation layer between the gate conductive layer and the buffer layer for separating the gate conductive layer from the buffer layer, the separation layer comprising a material having an etching selectivity with respect to the polysilicon.

In one embodiment, the hard mask layer includes a silicon oxynitride layer or a silicon oxide layer.

BRIEF DESCRIPTION OF THE DRAWINGS

The foregoing and other features and advantages of the invention will be apparent from the more particular description of an embodiment of the invention, as illustrated in the accompanying drawing. The drawing is not necessarily to scale, emphasis instead being placed upon illustrating the principles of the invention. Like reference characters refer to like elements throughout the drawings.

DESCRIPTION OF THE EMBODIMENTS

Embodiment 1

Figure 1:
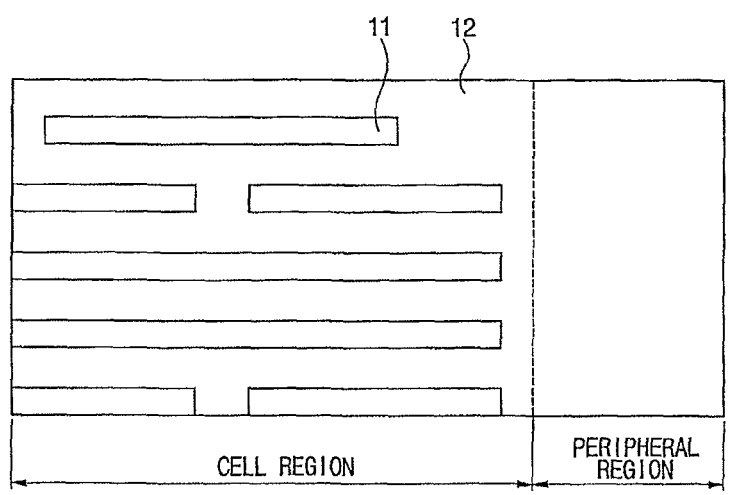
FIG. 1 is a plan view illustrating a semiconductor substrate that is divided into a cell region and a peripheral region.

FIG. 1 is a plan view illustrating a semiconductor substrate that is divided into a cell region and a peripheral region. FIGS. 2A through 8B are plan views and cross sectional views showing processing steps of a method of forming a pattern of an I-type static random access memory (SRAM) device according to a first embodiment of the present invention. Throughout FIGS. 2A through 8B, each capital letter A designates a plan view illustrating the I-type SRAM device, and each capital letter B designates a cross sectional view taken along the line I-I' of the corresponding figure designated by the capital letter A.

Referring to FIG. 1, a semiconductor substrate including a cell region and a peripheral region is provided. A unit memory device is positioned in the cell region, and a driving circuit for driving the unit memory device is positioned in the peripheral region. A plurality of N type impurities is selectively supplied to surface portions of the silicon substrate at which a P type metal-oxide semiconductor (PMOS) transistor is to be formed, thereby forming an N well. A conventional device isolation process is performed on the substrate including the N well, thus a plurality of active regions is defined in accordance with a plurality of field regions.

In detail, as an exemplary embodiment, a pad oxide layer, a silicon nitride layer and an anti-reflection layer (ARL) are formed on the substrate. The ARL comprises, for example, silicon oxynitride (SiON). A first photoresist film is coated on the silicon nitride layer, and an exposing process is performed on the first photoresist film using a predetermined exposure mask, thereby forming a first photoresist pattern.

Then, the ARL and the silicon nitride layer are partially etched using the first photoresist pattern as an etching mask, thereby forming a silicon nitride layer pattern and an ARL pattern, respectively. The pad oxide layer and the silicon substrate are partially etched using the silicon nitride layer pattern and an ARL pattern as a hard mask, thus a trench corresponding to the field region is formed on the substrate. The ARL pattern is removed during the etching process and a cleaning process subsequent to the etching process. The silicon oxide layer is coated on the silicon nitride pattern to a predetermined thickness such that the trench is filled with the silicon oxide layer. Then, the silicon oxide layer is polished until the silicon nitride layer pattern is exposed, thereby forming the field oxide layer 12.

The silicon nitride layer and the pad oxide layer are removed, and the active region is defined in accordance with the field region. As shown in FIG. 1, the active pattern 11 is formed to be a parallel line shape.

Figure 2A:
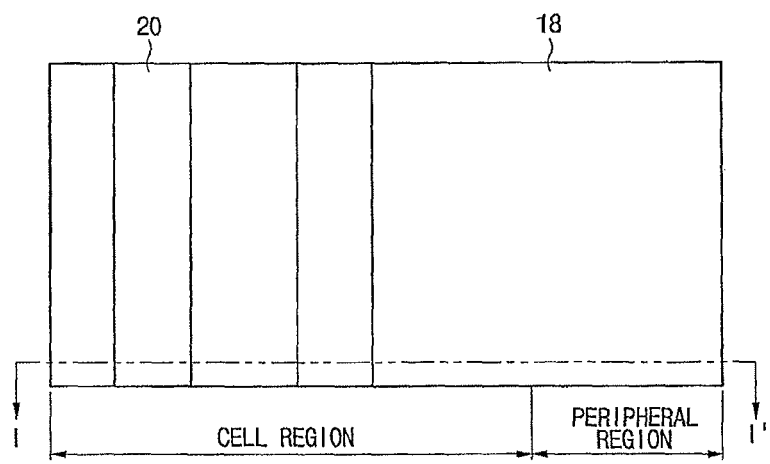
FIGS. 2A, 3A, 4A, 5A, 6A, 7A and 8A are plan views showing processing steps of a method of forming a pattern of an I-type static random access memory (SRAM) device according to a first embodiment of the present invention.
Figure 2B:
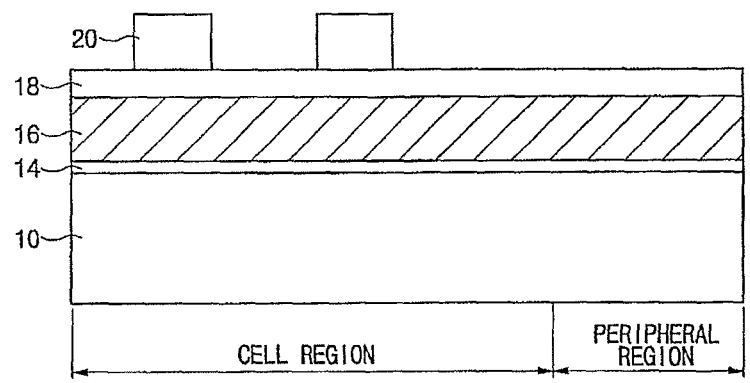
FIGS. 2B, 3B, 4B, 5B, 6B, 7B and 8B are cross-sectional views taken along line I-I' of FIGS. 2A, 3A, 4A, 5A, 6A, 7A and 8A, respectively.

Referring to FIGS. 2A and 2B, a gate oxide layer 14 is formed on the substrate 10 including the line shaped active pattern 11 to a thickness of about 10 Å to about 300 Å. A polysilicon layer 16 is formed on the gate oxide layer 14 as a gate electrode layer. A metal silicide layer (not shown) may be further formed on the polysilicon layer 16.

A buffer layer 18 is formed on the polysilicon layer 16. The buffer layer 18 comprises a material having an etching selectivity with respect to the polysilicon layer, such as silicon oxide. A thickness of a cell hard mask pattern for patterning the polysilicon layer is determined in accordance with a thickness of the buffer layer 18.

A second photoresist film is coated on the buffer layer 18, and the second photoresist film in the cell region is partially removed, and the second photoresist film in the peripheral region is completely removed. Therefore, a second photoresist pattern 20 is formed only in the cell region of the substrate 10. In the present embodiment, the second photoresist pattern 20 is positioned between gate patterns, so that a pair of the gate electrode patterns is formed below both side portions of the second photoresist pattern 20.

Figure 3A:
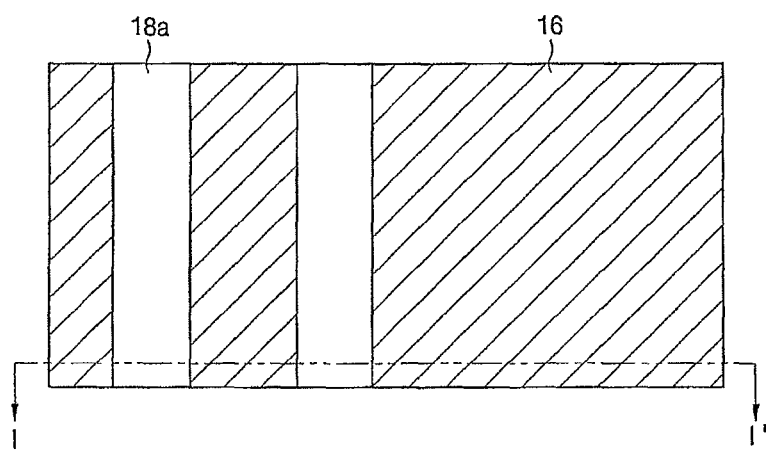
Figure 3B:
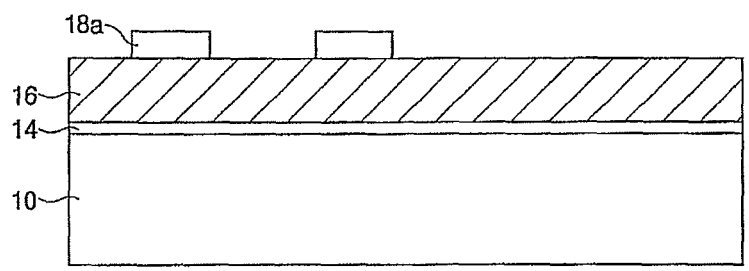

Referring to FIGS. 3A and 3B, the buffer layer 18 is partially etched using the second photoresist pattern as an etching mask, thus a line shaped buffer pattern 18a is formed on the polysilicon layer 16 in the cell region. Accordingly, a top surface of the polysilicon layer 16 is partially exposed through the buffer pattern 18a. An interval of the gate pattern may be controlled in accordance with a line width and an interval of the buffer pattern 18a. That is, when the line width of the buffer pattern 18a is reduced, the interval of a pair of the gate patterns is also reduced since the gate pattern is formed below both side portions of the buffer pattern 18a. In addition, when the interval of the buffer pattern 18a is reduced, an interval among a gate pattern group including a pair of the gate patterns formed below both side portions of the buffer pattern 18a is also reduced.

Figure 4A:
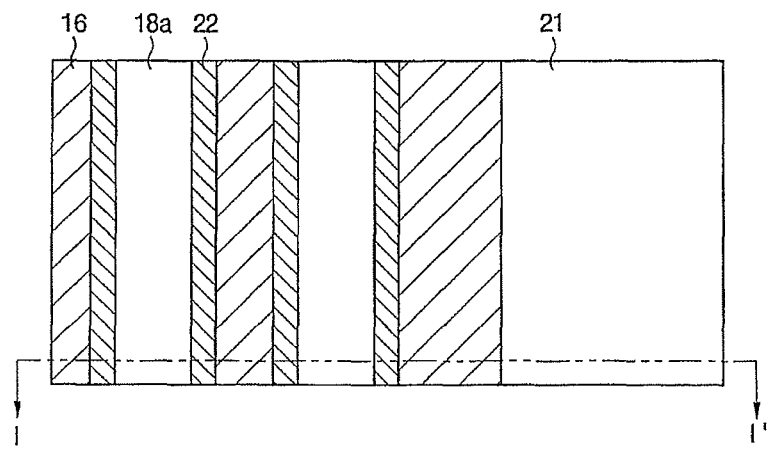
Figure 4B:
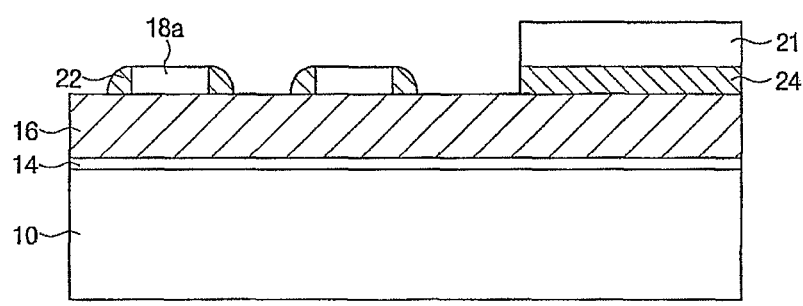

Referring to FIGS. 4A and 4B, a hard mask layer is formed on the polysilicon layer 16 and the buffer pattern 18a by a deposition process. The hard mask layer functions as an etching mask in an etching process for patterning the polysilicon layer 16 into a gate electrode. Therefore, the hard mask layer comprises a material having an etching selectivity with respect to both the buffer pattern 18a and the polysilicon layer 16. Examples of the hard mask layer include a silicon oxynitride layer, a silicon nitride layer, etc.

In the present embodiment, a thickness of the hard mask layer may be smaller than a critical dimension (CD) of a pattern formed by a photolithography process. In addition, a thickness or characteristic distribution of the hard mask layer is relatively small as compared with the hard mask layer formed by the photolithography process, since the deposition process is superior to the photolithography process in process stability.

A third photoresist layer is coated on the hard mask layer, and the third photoresist layer in the cell region is removed and the third photoresist layer in the peripheral region remains for masking the peripheral region, thereby forming a third photoresist pattern 21.

The hard mask layer is anisotropically etched, thus a spacer 22 is selectively formed along a sidewall of the buffer pattern 18a. When the anisotropical etching process is completed, the spacer 22 is formed on a sidewall of the buffer layer 18a in the cell region and the hard mask layer 24 remains in the peripheral region since the peripheral region is covered with the third photoresist pattern 21.

Figure 5A:
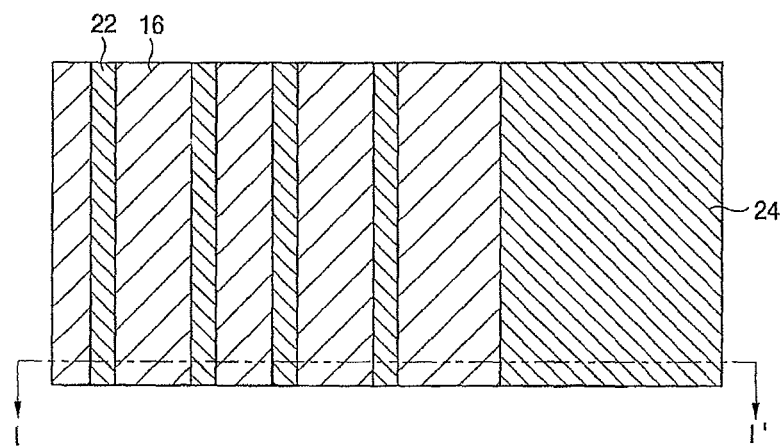
Figure 5B:
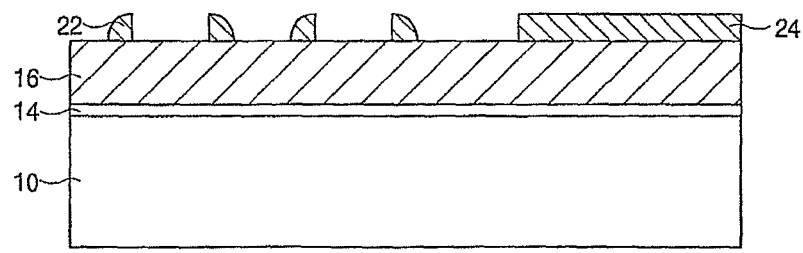

Referring to FIGS. 5A and 5B, the buffer pattern 18a is selectively removed through a dry or a wet etching process, thus the spacer 22 separated form the buffer layer 18a remains on the polysilicon layer 16 in the cell region along a first direction. For example, the first direction may be in parallel with a direction of a line shaped active pattern. The hard mask layer 24 still remains since the buffer pattern 18a is not disposed in the peripheral region.

Figure 6A:
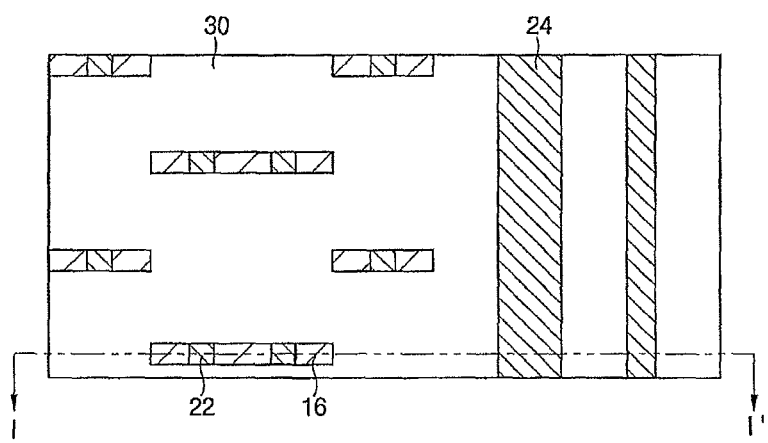
Figure 6B:
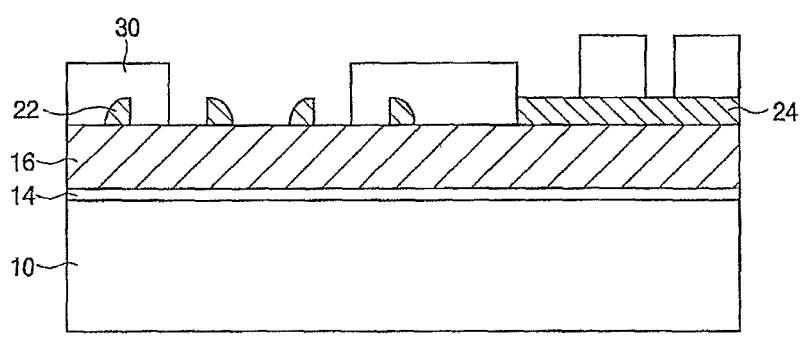

Referring to FIGS. 6A and 6B, a fourth photoresist film is coated on the spacer 22, the hard mask layer 24 and the polysilicon layer 16, and then is patterned into a fourth photoresist pattern 30 by the photolithography process. The photoresist pattern 30 in the cell region is used as a hard mask for forming the spacer 22 into a cell gate, and the photoresist pattern 30 in the peripheral region is used as a hard mask for forming the hard mask layer 24 into a peripheral gate.

The cell gate of the I-type SRAM is formed to be an independent pattern separated from each other just like islands perpendicular to the active pattern underlying the isolated independent pattern. Therefore, the line shaped spacer 22 is partially etched into a plurality of independently separated patterns perpendicular to the active region so as to pattern the spacer 22 into the hard mask for forming the cell gate.

Therefore, the fourth photoresist pattern 30 is formed in a second direction different from the first direction. In the present embodiment, the second direction is perpendicular to the first direction. Accordingly, the line shaped spacer 22 is partially exposed through the fourth photoresist pattern 30 in the cell region, and is to be etched in a subsequent process along the second direction. The fourth photoresist pattern 30 in the peripheral region is formed so as to form the peripheral gate in accordance with a design shape.

Figure 7A:
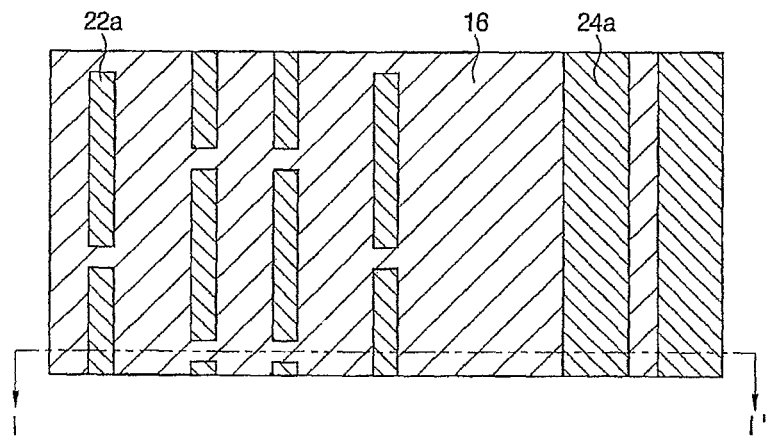
Figure 7B:
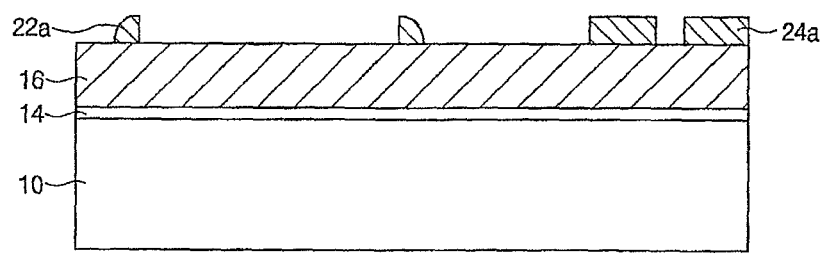

Referring to FIGS. 7A and 7B, the spacer 22 and the hard mask layer 24 are partially etched using the fourth photoresist pattern as an etching mask, so that the spacer 22 extending in the first direction is etched away in the second direction. Therefore, the spacer 22 is formed into the island-like pattern in the cell region, thereby forming a cell gate hard mask pattern 22a. The hard mask layer 24 in the peripheral region is formed into a peripheral gate hard mask pattern 24a. A line width of the cell gate hard mask pattern 22a can be less than that of the peripheral gate hard mask pattern 24a.

Accordingly, the cell gate hard mask pattern 22a has a line width smaller than the CD of the photolithography process, and the peripheral gate hard mask pattern does not have a repeated shape but various shapes. In addition, the cell gate hard mask pattern 22a is formed not by the conventional photolithography process, but rather by the deposition and anisotropic etching process, so that the above-mentioned line width variation and the line edge roughness are minimized.

Figure 8A:
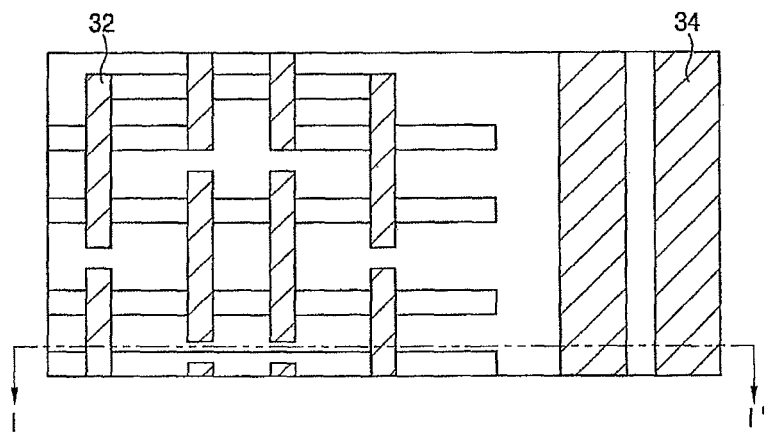
Figure 8B:
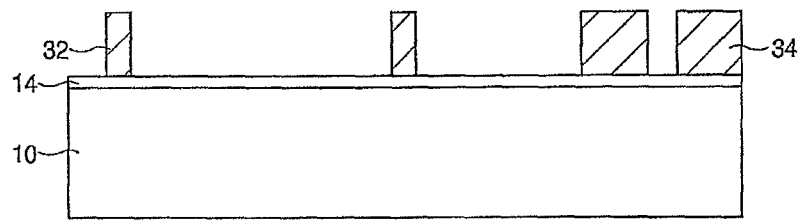

Referring to FIGS. 8A and 8B, the polysilicon layer 16 is partially etched using the cell and peripheral gate hard mask patterns 22a and 24a as an etching mask, so that a cell gate pattern 32 and a peripheral gate pattern 34 are formed at one time. Then, the cell gate and peripheral gate hard mask patterns 22a and 24a remaining on the cell gate pattern 32 and a peripheral gate pattern 34 are completely removed.

Embodiment 2

FIGS. 9A through 11 are plan views and cross sectional views showing processing steps of a method of forming a pattern of an I-type static random access memory (SRAM) device according to a second embodiment of the present invention. Throughout FIGS. 9A through 10B, each capital letter A designates a plan view illustrating the I-type SRAM device, and each capital letter B designates a cross sectional view taken along the line I-I' of the corresponding figure designated by the capital letter A.

The present second embodiment of the present invention is the same as the first embodiment of the present invention except that a separation layer is added between the gate electrode layer and the buffer layer.

Figure 9A:
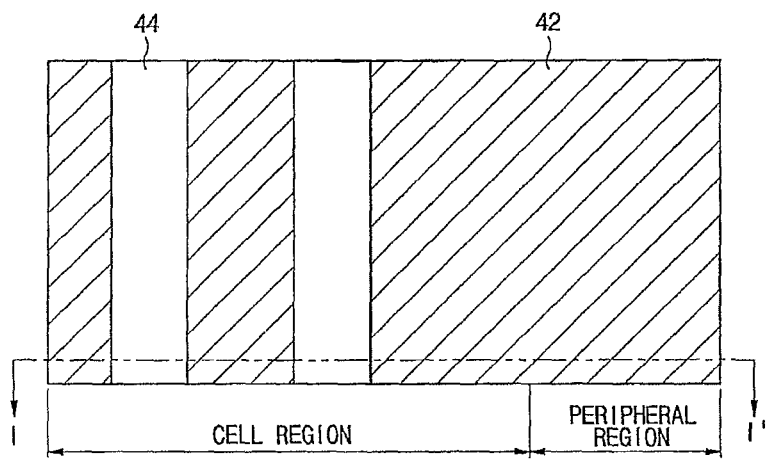
FIGS. 9A and 10A are plan views showing processing steps of a method of forming a pattern of an I-type SRAM device according to a second embodiment of the present invention.
Figure 9B:
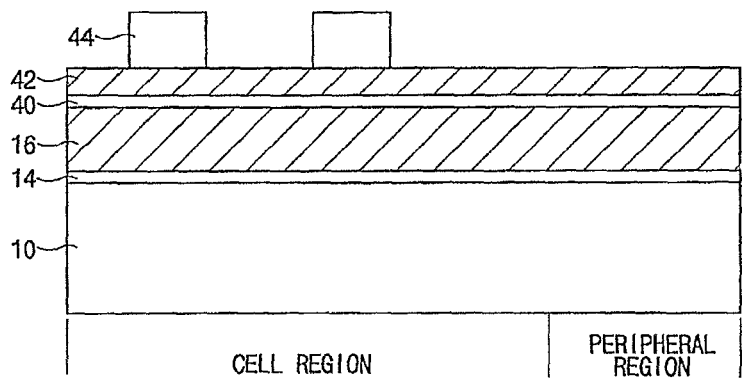
FIGS. 9B and 10B are cross-sectional views taken along line I-I' of FIGS. 9A and 10A, respectively.

Referring to FIGS. 9A and 9B, a semiconductor substrate 10 including a cell region and a peripheral region is provided, and a field region and an active region are defined by the same process as described in the first embodiment with reference to FIG. 1. Therefore, a unit memory device is positioned in the cell region, and a driving circuit for driving the unit memory device is positioned in the peripheral region. The active region is formed into a line shaped pattern on the substrate 10.

Then, a gate oxide layer 14 is formed on the substrate 10 including the line shaped active pattern to a thickness of about 10 Å to about 300 Å, and a first polysilicon layer 16 for forming a gate electrode is formed on the gate oxide layer 14. A metal silicide layer (not shown) may be further formed on the polysilicon layer 16.

A separation layer 40 is formed on the first polysilicon layer 16 for separating the first polysiliocn layer 16 and a buffer layer 42 formed thereon in a subsequent process. The separation layer 40 comprises a material having an etching selectivity with respect to the first polysilicon layer 16. Example of the separation layer 16 includes silicon oxide.

A second polysilicon layer is formed on the separation layer 40 as the buffer layer 42. That is, the buffer layer 42 has the same material as the gate electrode under the buffer layer 42, thus the separation layer 40 is used between the first and second polysilicon layers 16 and 40.

A photoresist film is coated on the second polysilicon layer 42. The photoresist film in the cell region is selectively removed, and the photoresist film in the peripheral region is completely removed, thus only the photoresist film in the cell region is formed into photoresist pattern 44. In the present embodiment, the photoresist pattern 44 is formed between gate patterns, so that a pair of the gate electrode patterns is positioned below both side portions of the photoresist pattern 44.

Figure 10A:
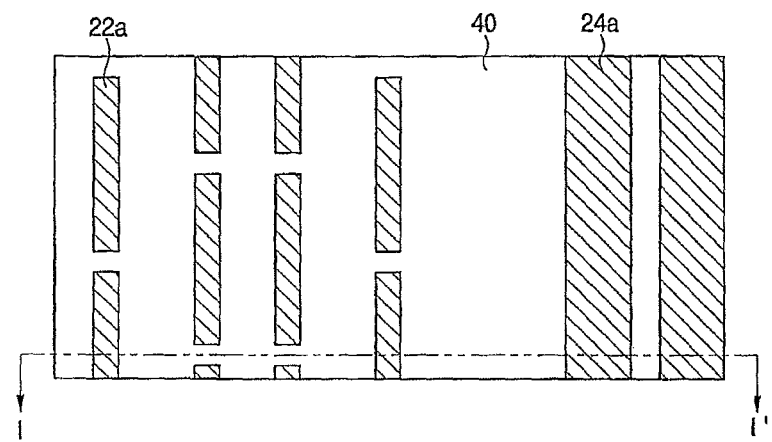
Figure 10B:
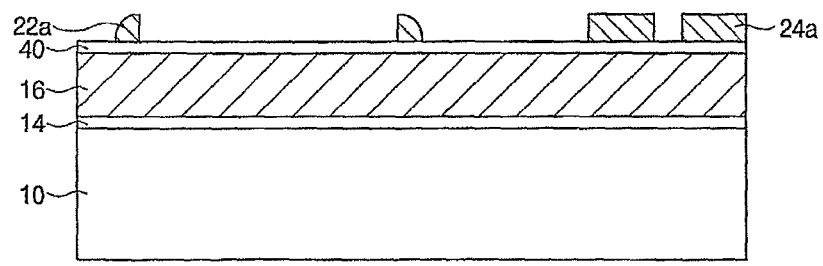

Referring to FIGS. 10A and 10B, a cell gate hard mask pattern 22a and a peripheral gate hard mask pattern 24a are formed on the separating layer 40 at a time by the same process as the first embodiment described with reference to FIGS. 3A through 7B.

Figure 11:
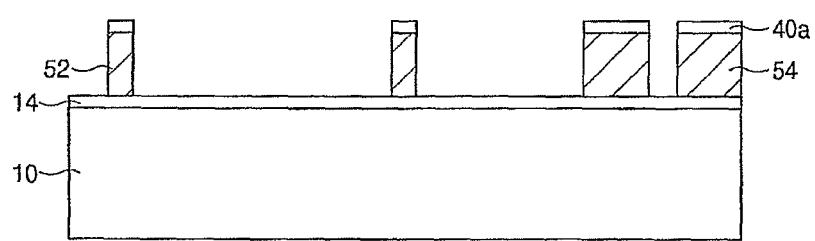
FIG. 11 is a cross-sectional view taken along line I-I' of the plan views of FIGS. 9A and 10A, showing additional process steps in the method of FIGS. 9A, 9B, 10A and 10B.

Referring to FIG. 11, the separating layer 40 and the first polysilicon layer 16 are sequentially etched using the cell and peripheral hard mask patterns 22a and 24a as an etching mask, thus a cell gate pattern 52, a peripheral pattern 54 and a separation layer pattern 40a are formed. The remaining cell and peripheral hard mask patterns 22a and 24a are removed from the cell gate pattern 52, the peripheral pattern 54 and the separation layer pattern 40a. The separating layer pattern 40a may remain on the peripheral pattern 54 or be removed from the peripheral pattern 54.

Embodiment 3

FIGS. 12A through 20B are plan views and cross sectional views showing processing steps of a method of forming a gate of an I-type static random access memory (SRAM) device according to a third embodiment of the present invention. Throughout FIGS. 12A through 20B, each capital letter A designates a plan view illustrating the I-type SRAM device, and each capital letter B designates a cross sectional view taken along the line I-I' of the corresponding figure designated by the capital letter A.

Figure 12A:
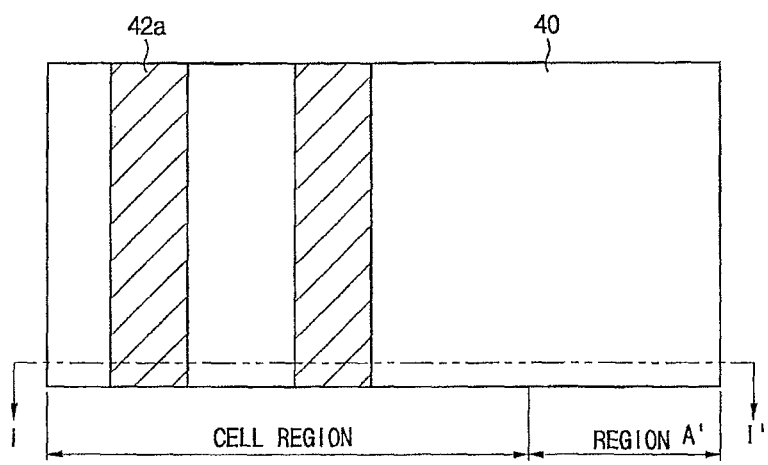
FIGS. 12A, 13A, 14A, 15A, 16A, 17A, 18A, 19A and 20A are plan views showing processing steps of a method of forming a gate of an I-type static random access memory (SRAM) device according to a third embodiment of the present invention.
Figure 12B:
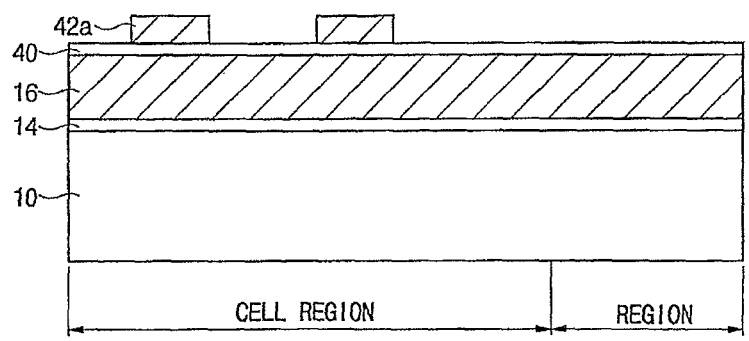
FIGS. 12B, 13B, 14B, 15B, 16B, 17B, 18B, 19B and 20B are cross-sectional views taken along line I-I' of FIGS. 12A, 13A, 14A, 15A, 16A, 17A, 18A, 19A and 20A, respectively.

Referring to FIGS. 12A and 12B, a semiconductor substrate 10 including a cell region and a peripheral region is provided, and a field region and an active region are defined by the same process as described in the second embodiment with reference to FIGS. 9A and 9B. Therefore, a unit memory device is positioned in the cell region, and a driving circuit for driving the unit memory device is positioned in the peripheral region. The active region is formed into a line shaped pattern on the substrate 10.

Then, a gate oxide layer 14 is formed on the substrate 10 including the line shaped active pattern to a thickness of about 10 Å to about 300 Å, and a first polysilicon layer 16 for forming a gate electrode is formed on the gate oxide layer 14. A metal silicide layer (not shown) may be further formed on the polysilicon layer 16. A separation layer 40 is formed on the first polysilicon layer 16 for separating the first polysilicon layer 16 and a buffer layer 42 formed thereon in a subsequent process. The separation layer 40 comprises a material having an etching selectivity with respect to the first polysilicon layer 16. An example of the separation layer 16 includes silicon oxide.

A second polysilicon layer is formed on the separation layer 40 as the buffer layer 42. The buffer layer 42 has the same material as the gate electrode under the buffer layer 42, thus the separation layer 40 is necessarily required between the first and second polysilicon layers 16 and 40. A thickness of the cell hard mask pattern for patterning the first polysilicon layer 16 is determined in accordance with a thickness of the second polysilicon layer 42.

A first photoresist film (not shown) is coated on the second polysilicon layer 42. The first photoresist film in the cell region is selectively removed, and the first photoresist film in the peripheral region is completely removed, thus only the first photoresist film in the cell region is formed into a first photoresist pattern. In the present embodiment, the first photoresist pattern is formed between gate patterns, so that a pair of the gate electrode patterns is positioned below both side portions of the photoresist pattern.

Then, the second polysilicon layer is selectively etched using the first photoresist pattern as an etching mask by the same process as the second embodiment described with reference to FIGS. 9A and 9B, so that a second polysilicon pattern 42a having a line shape is formed on the separation layer 40 in the cell region, and a top surface of the separation layer 40 is partially exposed through the second polysilicon pattern 42a. An interval of a gate pattern that is to be formed in a subsequent process may be controlled in accordance with a line width and an interval of the second polysilicon pattern 42a. That is, when the line width of the second polysilicon pattern 42a is reduced, the interval of a pair of the gate patterns is also reduced since the gate pattern is formed below both side portions of the second polysilicon pattern 42a. In addition, when the interval of the second polysilicon pattern 42a is reduced, an interval among a gate pattern group including a pair of the gate patterns formed below both side portions of the second polysilicon pattern 42a is also reduced.

Figure 13A:
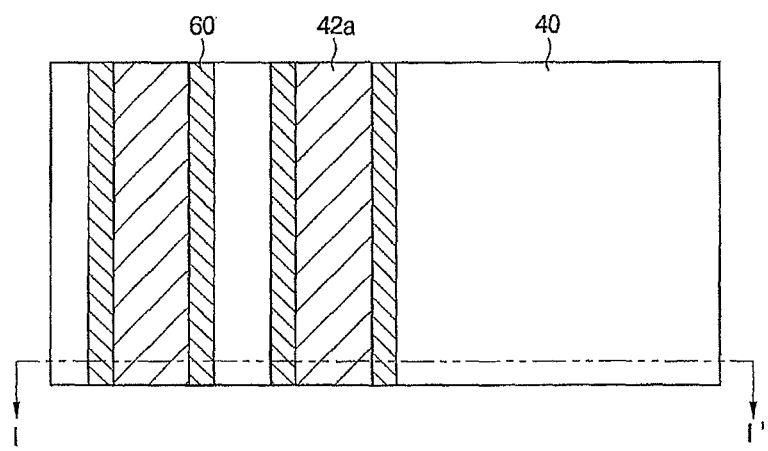
Figure 13B:
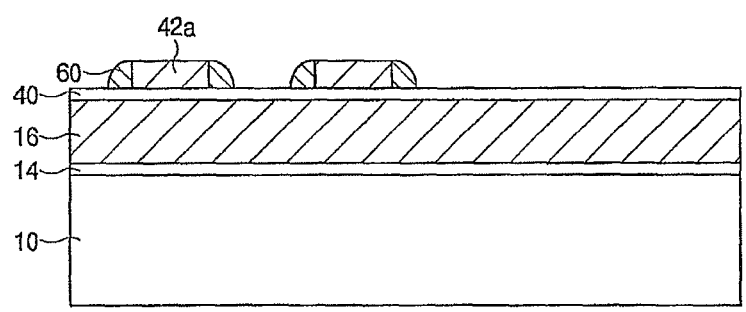

Referring to FIGS. 13A and 13B, a space layer such as a silicon oxynitride layer or a silicon nitride layer is formed on the separation layer 40 and the second polysilicon pattern 42a for forming a spacer 60 by a deposition process. The spacer layer comprises a material having an etching selectivity with respect to the second polysilicon pattern 42a.

In the present embodiment, a thickness of the spacer layer may be formed to be less than the CD of a pattern formed by the conventional photolithography process, and a thickness or a characteristic distribution of the spacer layer is relatively small as compared with the spacer layer formed by the photolithography process, since the deposition process is superior to the photolithography process in process stability.

Then, the spacer layer is anisotropically removed by, for example, an etching process, and a spacer 60 that comprises, for example, nitride, is selectively formed along a sidewall of the second polysilicon pattern 42a. That is, when the anisotropical etching process is completed, a remaining portion of the spacer layer except for the spacer 60 along the sidewall of the second polysilicon pattern 42a is removed in the cell region and the peripheral region. Therefore, the top surface of the separating layer 40 is partially exposed in the cell region, and is completely exposed in the peripheral region. The spacer 60 is used as a hard mask pattern for forming a cell gate in a subsequent process.

Figure 14A:
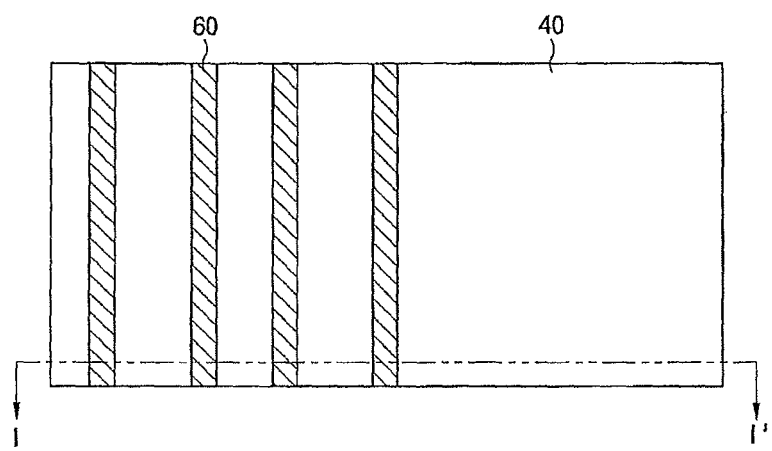
Figure 14B:
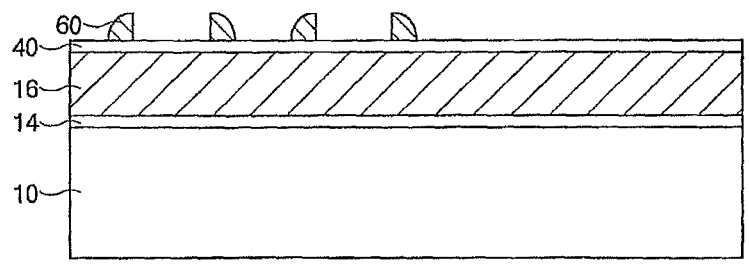

Referring to FIGS. 14A and 14B, the second polysilicon layer 42a is selectively removed from the separating layer 40 by a dry or a wet etching process, thus only a plurality of the spacers 60 remains on the separating layer 40 at a predetermined interval in the cell region along a first direction, and no spacer remains on the separating layer 40 in the peripheral region. That is, the top surface of the separating layer 40 is partially exposed in the cell region, and is completely exposed in the peripheral region. For example, the first direction may be in parallel with a direction of a line shaped active pattern.

Figure 15A:
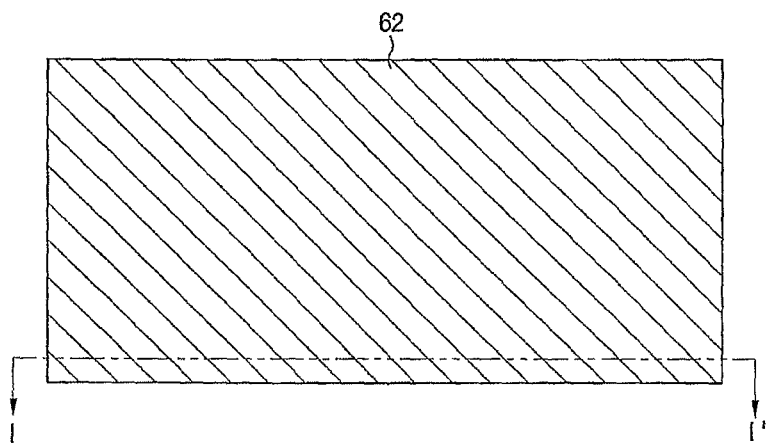
Figure 15B:
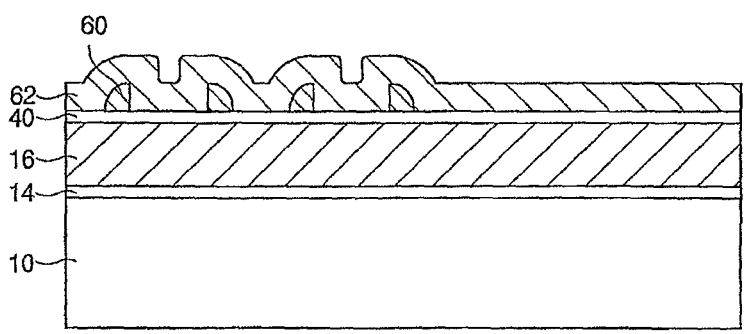

Referring to FIGS. 15A and 15B, a hard mask layer 62 is formed on the separating layer 40 on which the spacer is formed having a profile representing the spacer 60. That is, the hard mask layer 62 corresponding to the spacer 60 is protruded upwardly as compared with the hard mask layer 62 corresponding to the separating layer 40 in the peripheral region.

The hard mask layer 62 comprises the same material as the spacer 60 or a material having an etching selectivity with respect to the spacer 60. The hard mask layer 62 and the spacer 60 can have the same etching characteristics since the hard mask layer 62 and the spacer 60 are used as a peripheral hard mask pattern and a cell hard mask pattern, respectively, in a subsequent process. Examples of the hard mask layer 62 include a silicon oxynitride layer, a silicon nitride layer, etc.

Figure 16A:
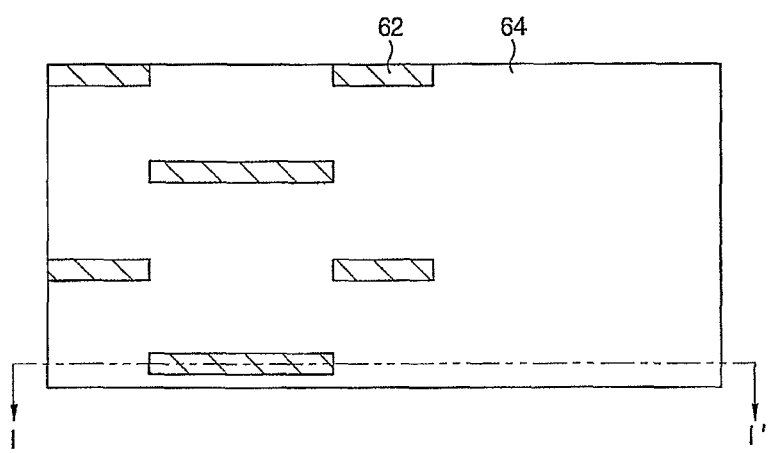
Figure 16B:
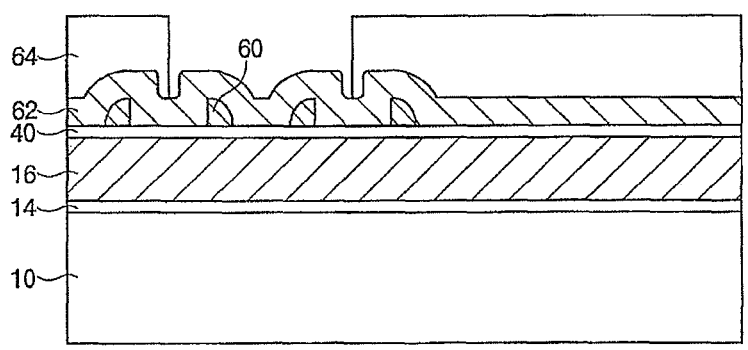

Referring to FIGS. 16A and 16B, a second photoresist film is coated on the hard mask layer 62, and then is partially removed by the photolithography process to be formed into a second photoresist pattern 64 in a second direction different from the first direction. For example, the second direction is perpendicular to the first direction. The second photoresist film in the cell region is partially removed, thus a hard mask pattern for forming the cell gate is formed in the cell region. The second photoresist film in the peripheral region is not removed, thus the hard mask layer 62 is completely covered with the second photoresist film in the peripheral region. In detail, the hard mask layer 62 is partially exposed through the second photoresist pattern 64 in the cell region, and is to be etched in a subsequent process along the second direction.

The cell gate of the I-type SRAM is formed to be an independent pattern separated from each other just like islands perpendicular to a line shaped active pattern underlying the island-like pattern. The independently separated island-like pattern may be formed by partially etching a cell gate electrode layer using the hard mask pattern as an etching mask. In the present embodiment, the hard mask layer is etched along the second direction perpendicular to the first direction.

Figure 17A:
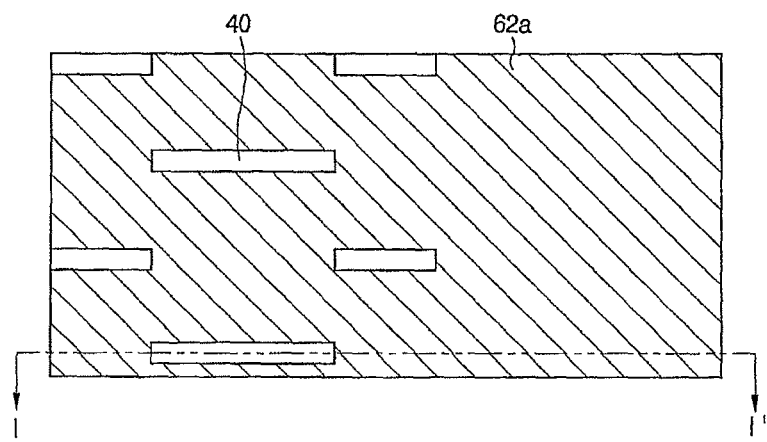
Figure 17B:
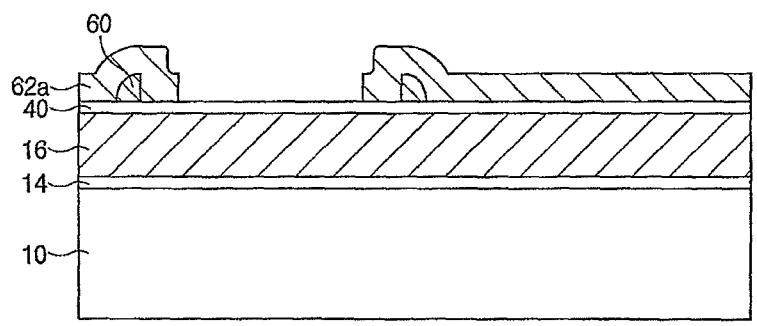

Referring to FIGS. 17a and 17b, the hard mask layer 62 and the spacer 60 are etched using the second photoresist pattern 64 as an etching mask in the second direction until the separating layer 40 is partially exposed through the second photoresist pattern 64. Accordingly, the hard mask layer 62 and the spacer 60 extending in the first direction are partially trimmed away in the second direction in the cell region of the substrate. Therefore, the spacer 60 is formed into the island-like pattern in the cell region. The second photoresist pattern 64 remaining on the hard mask layer 62 is removed by a conventional ashing and stripping process.

Figure 18A:
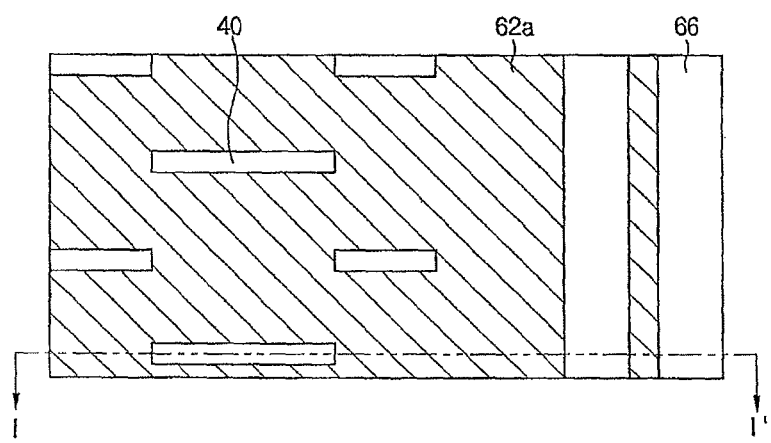
Figure 18B:
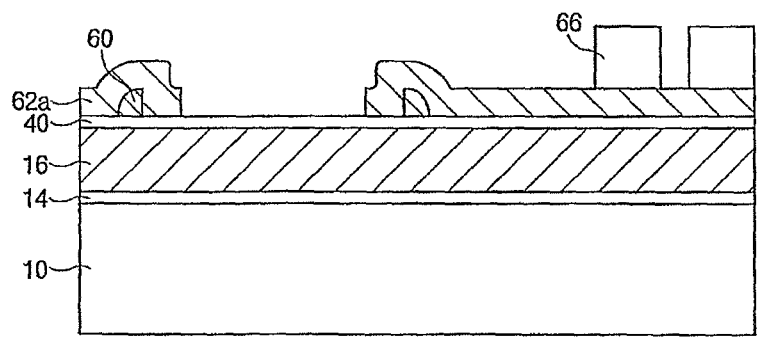

Referring to FIGS. 18A and 18B, a third photoresist film is coated on the trimmed hard mask layer 62, and is partially removed by a photolithography process thereby forming a third photoresist pattern 66. That is, while the third photoresist film in the cell region is completely removed, and the hard mask layer is fully exposed, the third photoresist film in the peripheral region is partially removed, and the hard mask layer is partially exposed through the third photoresist pattern 66 in the peripheral region. The third photoresist pattern 66 is used as a mask pattern for forming a peripheral gate in the peripheral region of the substrate.

Figure 19A:
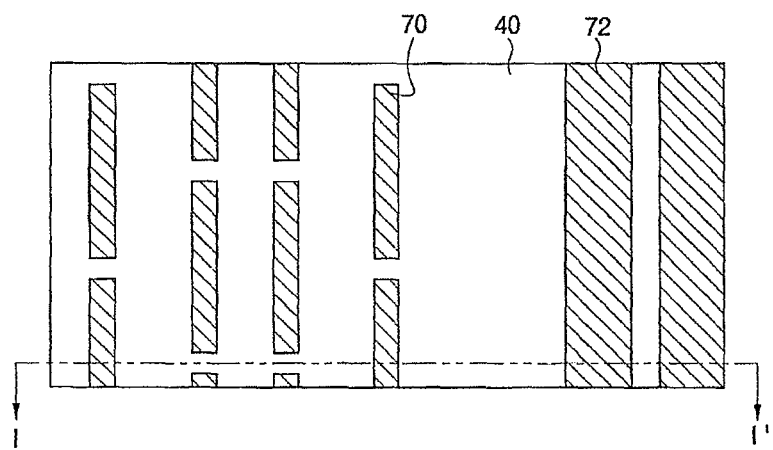
Figure 19B:
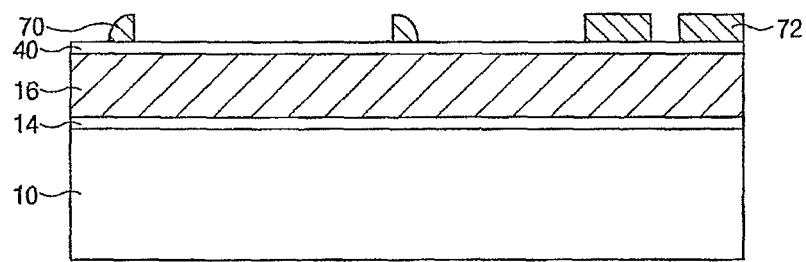

Referring to FIGS. 19A and 19B, the hard mask layer 62a is anisotropically etched using the third photoresist pattern 66 as an etching mask, so that a hard mask pattern 70 and 72 is formed on the cell region and peripheral region, respectively. Then, the third photoresist pattern 66 is removed by a conventional ashing and stripping process.

In detail, the hard mask pattern 62a in the cell region is completely etched away, thus the spacer 60 and the separating layer 40 is exposed. In the present embodiment, the spacer 60 that has been already formed into the independently separated island-like pattern by a former trimming process is used as a hard mask pattern 70 for forming a cell gate electrode. The hard mask pattern 62a in the peripheral region is used as a peripheral hard mask pattern 72 for forming a peripheral gate. In the present embodiment, the cell gate hard mask pattern 70 has a smaller line width than the peripheral hard mask pattern 72.

Figure 20A:
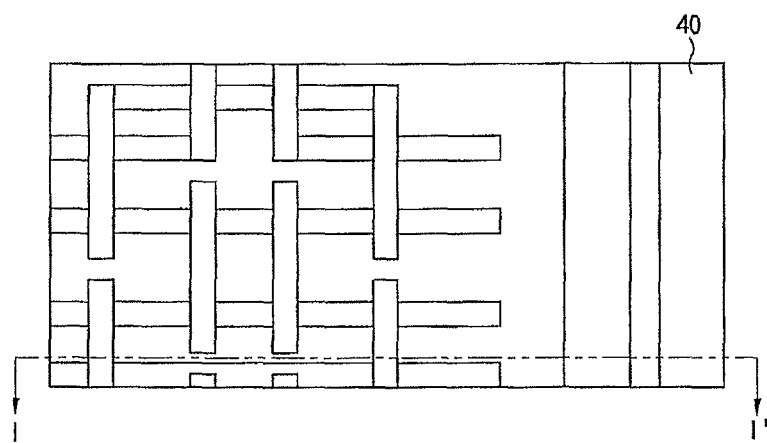
Figure 20B:
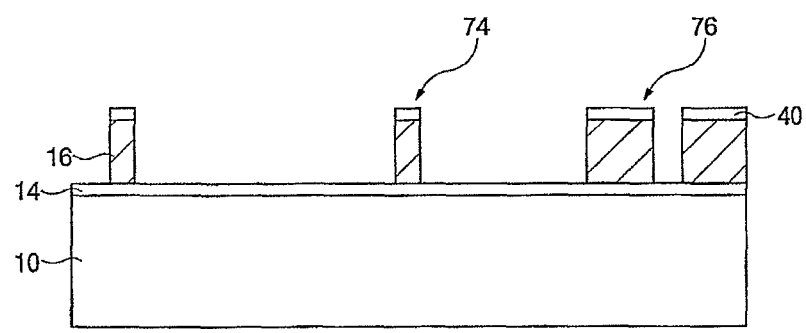

Referring to FIGS. 20A and 20B, the separating layer 40 and the first polysilicon layer 16 are partially etched using the cell and peripheral hard mask patterns 70 and 72 as an etching mask, thereby forming the cell and peripheral gate patterns 74 and 76. Then, the cell and peripheral gate hard mask patterns 70 and 72 remaining on a patterned separating layer 40 are completely removed. The patterned separating layer may remain on a patterned first polysilicon layer, or be completely removed from the patterned first polysilicon layer.

The present embodiment of the invention may be modified without using the separation layer in a similar way described in the first embodiment of the invention, as would be known to one of the ordinary skill in the art. The gate electrode layer and the buffer layer may comprise different materials, such that the separating layer is not required. Accordingly, the modified embodiment is the same as the third embodiment of the present invention except that no separation layer is provided between the first and second polysilicon layers since the first and second polysilicon layers comprise the same material.

Hereinafter, the modified embodiment is described in detail.

The semiconductor substrate including a cell region and a peripheral region is provided, and a field region and an active region are defined as described with reference to FIGS. 12A and 12B. Therefore, a unit memory device is positioned in the cell region, and a driving circuit for driving the unit memory device is positioned in the peripheral region. The active region is formed into a line shaped pattern on the substrate.

Then, a gate oxide layer is formed on the substrate including the line shaped active pattern to a thickness of about 10 Å to about 300 Å, and a polysilicon layer for forming a gate electrode is formed on the gate oxide layer. A metal silicide layer may be further formed on the polysilicon layer.

A buffer layer is formed on the polysilicon layer. The buffer layer comprises a material having an etching selectivity with respect to the polysilicon layer such as silicon oxide. According to the same process described above, the cell and peripheral gate electrode patterns are formed on the substrate.

According to the embodiments of the present invention, the gate pattern has a smaller line width in the cell region than in the peripheral region. The gate pattern is also formed to have a line width smaller than the CD of the photolithography process by using the deposition process. In addition, since the gate pattern is formed without using the photolithography process, a recent expensive short wave exposing apparatus and a photoresist material related thereto are not required, so that manufacturing cost for the high minute gate pattern is reduced. Furthermore, since the gate pattern is formed by the etching process using a hard mask pattern as an etching mask, the above-mentioned problems due to the photolithography process such as the line width variation and the edge roughness may be minimized. Although the above exemplary embodiments discuss the cell gate and the peripheral gate of the I-type SRAM device, an active pattern or a metal wiring could also be formed by the same method discussed above, as would be known to one of an ordinary skill in the art.

In particular, when the line width of the gate pattern is less than or equal to about 70 um, the cost for performing the photolithography process is remarkably increased due to the very high price thereof. Therefore, the present invention considerably reduces the manufacturing cost of the semiconductor device by patterning the fine gate pattern without using the photolithography process as well as minimizing the line width variation and the edge roughness.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a semiconductor device, comprising:
    forming an object layer on a substrate;
    forming a first pattern on the object layer in a first region of the substrate, the first pattern having a plurality of spacers that are spaced apart from and parallel with each other;
    forming a second pattern on the object layer in a second region of the substrate; and
    patterning the object layer on the substrate using the first and second patterns as a mask, respectively.

2. The method of claim 1, wherein the object layer includes a conductive layer, so that first and second conductive patterns are formed on the substrate corresponding to the first and second patterns, respectively.

3. The method of claim 1, wherein forming the first pattern includes:
    forming a buffer pattern on the object layer;
    forming the spacers on sidewalls of the buffer pattern; and
    removing the buffer pattern from the object layer of the substrate, so that the spacers remain on the object layer and spaced apart from each other.

4. The method of claim 3, wherein forming the buffer pattern includes:
    forming a buffer layer on the object layer of the substrate;
    forming a photoresist pattern on the buffer layer, so that the buffer layer is partially exposed through the photoresist pattern; and
    patterning the buffer layer using the photoresist pattern as a mask, so that the buffer layer is formed into the buffer pattern.

5. The method of claim 4, wherein the buffer layer in the first region of the substrate is formed into the buffer pattern and the buffer layer in the second region of the substrate is removed from the object layer, so that the object layer in the first region of the substrate is partially exposed through the buffer pattern and the object layer in the second region of the substrate is wholly exposed in the second region of the substrate.

6. The method of claim 4, further comprising forming a separation layer between the object layer and the buffer layer, the separation layer comprising a material having an etching selectivity with respect to the object layer.

7. The method of claim 3, wherein forming the spacers on the sidewalls of the buffer pattern includes:
    forming a first mask layer on the buffer pattern and the object layer; and
    performing an etching process against the first mask layer, so that the first mask layer remains on the sidewalls of the buffer pattern, to thereby form the spacers on the sidewall of the buffer pattern.

8. The method of claim 1, wherein forming the second pattern on the object layer includes:
    forming a second mask layer on the object layer and the first pattern;
    forming a photoresist pattern on the second mask layer; and
    etching the second mask layer using the photoresist pattern as an etching mask, so that the second mask layer is formed on a portion of the object layer in which the first pattern is not positioned.

9. The method of claim 8, wherein a width of the first pattern corresponds to a width of the spacer and a width of the second pattern corresponds to a critical dimension of a photolithography process for forming the second pattern.

10. The method of claim 1, wherein patterning the object layer using the first pattern and the second pattern are simultaneously performed.

11. A method of manufacturing a semiconductor device, comprising:
    providing a semiconductor substrate on which first and second regions are defined, an object layer and a buffer layer being sequentially stacked on the substrate across the first and second regions;
    forming a first photoresist pattern on the buffer layer in the first region;
    transforming the buffer layer in the first region into a buffer pattern by a photolithography process using the first photoresist pattern as a mask;
    forming a first pattern on the object layer in the first region as a spacer on a sidewall of the buffer pattern;
    forming a mask layer on the object layer and the first pattern across the first and second regions;

forming a second photoresist pattern on the mask layer on the object layer in the second region of the substrate;

forming a second pattern on the object layer in the second region using the second photoresist pattern as a mask; and patterning the object layer using the first and second patterns as a mask.

12. The method of claim 11, wherein forming the first pattern on the object layer includes:

forming a spacer layer on the object layer conformally with the buffer pattern of which features are derived from the first photoresist pattern;

performing an etching process against the spacer layer, so that the spacers are formed on the sidewalls of the buffer pattern; and removing the buffer pattern from the object layer in the first region of the substrate, so that the spacers remain on the object layer in the first region.

13. The method of claim 12, wherein features of the second pattern are derived from the second photoresist pattern by the photolithography process, so that a width of the first pattern is smaller than that of the second pattern.

14. The method of claim 11, further comprising forming a separation layer between the object layer and the buffer layer, so that the first pattern is formed on the separation layer and the mask layer covering the first pattern is formed on the separation layer, the separation layer comprising a material having an etching selectivity with respect to the object layer.

15. The method of claim 14, wherein forming the second pattern on the object layer includes:

partially removing the mask layer from the separation layer in the second region using the second photoresist pattern as a mask, to thereby form a mask pattern on the separation layer; and partially removing the separation layer from the object layer in the second region using the second photoresist pattern as a mask, to thereby form a separation pattern on the object layer.

16. The method of claim 11, after patterning the object layer, further comprising patterning the substrate continuously using the first and second patterns as a mask.

17. The method of claim 11, wherein the object layer is simultaneously patterned both in the first region and in the second region of the substrate using the first and second patterns as a mask, respectively.

* * * * *